March 10, 1970 K. N. HASTINGS 3,500,440

FUNCTIONAL BUILDING BLOCKS FACILITATING MASS PRODUCTION OF ELECTRONIC EQUIPMENT BY UNSKILLED LABOR

Filed Jan. 8, 1968

INVENTOR

KINGSLEY N. HASTINGS

BY Birch + Birch

ATTORNEY

United States Patent Office 3,500,440

Patented Mar. 10, 1970

3,500,440

FUNCTIONAL BUILDING BLOCKS FACILITATING MASS PRODUCTION OF ELECTRONIC EQUIPMENT BY UNSKILLED LABOR

Kingsley N. Hastings, New York, N.Y., assignor to Interamericano Projects, Inc., New York, N.Y., a corporation of New York Filed Jan. 8, 1968, Ser. No. 696,445
Int. Cl. H05k *5/02*
U.S. Cl. 174—52 15 Claims

ABSTRACT OF THE DISCLOSURE

Functional building blocks for the mass production of electronic devices such as radios and the like by unskilled labor are provided and comprise compartmented housing receiving an integrated circuit chip or the like in each compartment thereof, electromagnetic shields between compartments, pre-aligned mounting means in portions of the housing and an integral indexed support for external circuit components. Each functional building block assembly further includes structure permitting simple soldered connections of external components to the circuit leads of integrated circuit chips, obviating the need for printed circuit boards and/or special terminal devices.

This invention relates to circuit components and more particularly to prefabricated circuit components and housings therefor, combined in a functional building block of such strength and simplicity as to permit assembly into functional electronic devices or the like by unskilled labor.

It is an object of this invention to provide new and novel circuit components comprising functional building blocks for electronic devices such as radio receivers and the like which are of optimally minimum cost and optimally maximum strength and simplicity, whereby local unskilled labor in underdeveloped areas can readily manufacture radios and the like at a price which the populace of such areas can afford.

Another object of this invention is to provide a new and novel housing structure for circuit devices comprising combinations of integrated circuit chips and external components, said housing structure being characterized by strength, simplicity of design and versatility which renders its incorporation into consumer devices substantially foolproof.

Still another object of this invention is to provide a bonded, hermetically sealed, multiple component containing an isolating functional package or housing structure which is compatible with known microminiaturization techniques, thereby effecting ease and versatility of use and economy of manufacture.

Still another object of this invention is to provide a new and novel functional circuit package structure capable of containing uncased junction devices.

Still another object of this invention is to provide a new and novel functional circuit package structure having enhanced heat dissipation characteristics.

Still another object of this invention is to provide a new and novel functional circuit package structure providing enhanced isolation between active and passive multiple element and other semiconductor devices located within the said package structure.

Yet another object of this invention is to provide a new and novel compartmented housing structure for integrated circuit chips and the like, wherein said chips are individually located in said compartments, and including new and novel magnetic shielding means between adjacent compartments.

These and other objects of this invention will become more fully apparent with reference to the following specification and drawings which relate to a preferred embodiment of the invention.

Figure 1:
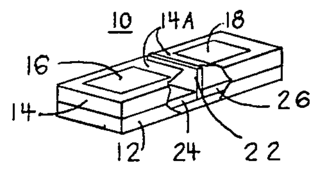
FIGURE 1 is a perspective of the main body portion of a functional circuit package of the present invention.

Referring in detail to the drawings, and more particularly to FIG. 1, the main body portion 10 of the package structure of the present invention is shown as including a base plate 12 on which is superimposed a coterminate, unitary frame 14, the latter defining first and second individual compartments or cavities 16 and 18, respectively. The compartments 16 and 18 are adapted to receive integrated circuit assemblies as will hereinafter be more fully described.

Figure 2:
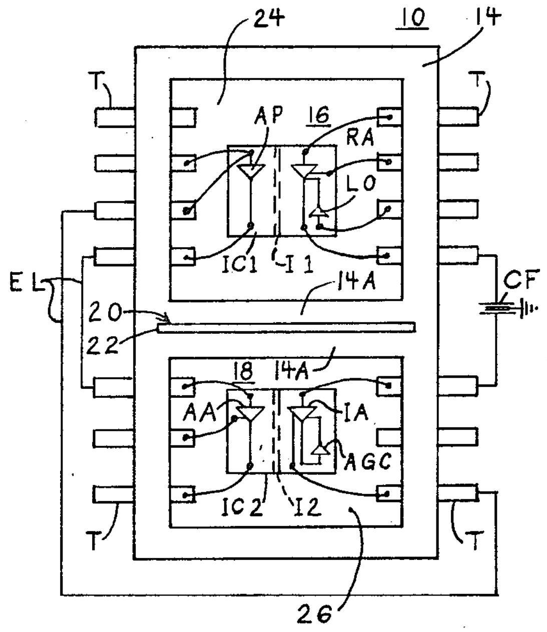
FIGURE 2 is a top plan view of a package body similar to the structure of FIG. 1 with circuit components schematically shown therein and terminals affixed thereto.

Referring jointly to FIGS. 1 and 2, the frame 14 is shown as having an integral transverse partition 14A separating the two compartments 16 and 18 therein. The transverse partition 14A is relieved to provide a vertical slot 20 therethrough, disposed transversely of the frame 14 and extending beyond the lateral boundaries of the first and second compartments 16 and 18 into the said frame 14.

The vertical slot 20 in the transverse partition 14A receives, is filled with, and mounts a coextensive electrromagnetic isolating shielding plate 22 which extends from the base member 12 to a point above the upper surface of the transverse partition 14A.

Thus, the shielding plate 22 extends beyond all of the boundaries of the first and second compartments 16 and 18 as will hereinafter be more fully described. The shielding plate 22 may comprise an iron core sandwiched between layers of aluminum.

The first and second compartments 16 and 18 are respectively bounded by and contain first and second ceramic or other suitable (plastic, glass, epoxy, metal, etc.) substrate layers 24 and 26, which are respectively coextensive with the said compartments and in juxtaposition with the base plate 12. The substrate layers 24 and 26 are bonded to, molded in or otherwise affixed to the base plate 12. Alternatively, such substrate layers may comprise the base plate 12, depending on the material from which the said base plate is fabricated.

The first and second substrate layers 24 and 26 are coterminate in width with the electromagnetic isolating and shielding plate 22 and are juxtaposed with the latter on opposite sides thereof.

As generally indicated in FIG. 1, the base plate 12 is relieved or recessed to fully cover the outer edge portions of the substrate layers 24 and 26.

The first and second substrate layers 24 and 26, respectively, have first and second integrated circuit chips IC1 and IC2 substantially centrally mounted thereon by suitable methods. Thus, the first and second compartments 16 and 18 in the frame 14 respectively house the first and second circuit chips IC1 and IC2.

Figure 3:
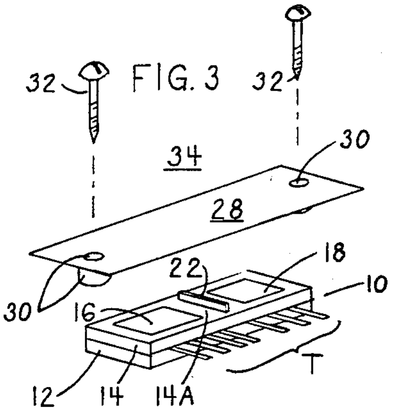
FIGURE 3 is an exploded view, in perspective, of a functional circuit package structure of the present invention illustrating mounting means, terminal structures and shielding means therein.

Referring jointly to FIGS. 2 and 3, wherein the latter like parts to all other embodiments bear like numerals, a plurality of mechanically strong electric terminals T are shown as extending from inside the compartments 16 and 18 to positions external with respect to the main body portion 10, between the base plate 12 and the unitary frame 14. The internal portions of the electric terminals T overly the substrate layers 24 and 26 adjacent the circuit chips IC1 and IC2 in the respective compartments 16 and 18.

As a matter of example, the first circuit chip IC1 may include an audio preamplifier AP on one side of a first isolation means 11, and a radio frequency amplifier RA and local oscillator LO on the other side of the first isolation means I1.

By the same example, the second circuit chip IC2 may include an audio amplifier AA on one side of a second isolation means I2 and an intermediate frequency amplifier IA and automatic gain control circuit AGC on the other side of the second isolation means I2.

A further shown by FIG. 2, each of the amplifiers and other circuits AP, RA, LO, AA, IA and AGC are either functionally interconnected on their respective chips IC1 and IC2 on their sides of the isolation means I1 and I2, or are connected to the inner ends of the mechanically strong electric terminals T. Certain of the terminals T may be interconnected with external leads EL while certain other leads T may be connected to external circuit components such as the ceramic filter element CF.

Thus, it can be seen that the circuit compartments 16 and 18 in the main body portion 10, provide in a single functional package sufficient built-in circuitry such that a simple series of external interconnection of the terminals T and the connection to said terminals of external components, such as the filter CF, can effect the full electronic circuitry necessary to manufacture an electronic device such as a radio receiver or the like.

For further example, the mere addition of an antenna, controls, a battery and an output speaker to the package of FIG. 2 may be all that is necessary to provide a complete radio receiver.

As shown in FIG. 3, a top or cover plate 28 is provided to close the circuit compartments 16 and 18 in the frame 14.

The cover plate 28, in the embodiment shown, is provided with prefabricated mounting sockets 30, or similar means, located on each end thereof, adapted to receive hold-down screws 32 or other suitable fasteners for securing the now fully enclosed package 34 to a chassis or the like (not shown). The cover plate 28 is adapted to be bonded or sealed to the frame 14 which in turn is bonded or sealed to the base plate 12 to completely seal the fully-enclosed package 34, making it a single electrical circuit unit or functional building block.

The cover plate 28 is dimensioned to overlap the frame 14 and base plate 12 of the unit or package 34 so that the mounting sockets 30 and hold-down screws 32 clear the said frame and base plate.

Further, the cover plate 28 may be fabricated from a material of relatively good heat conductivity to effect radiant heat transfer to atmosphere from the unit package 34.

Figure 4:
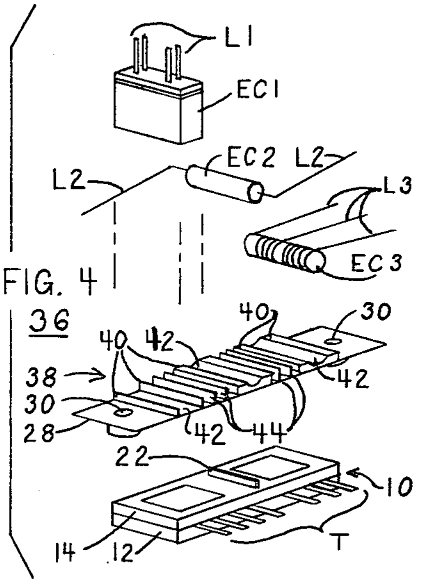
FIGURE 4 is an exploded view, in perspective, of a functional circuit package structure of the present invention illustrating the details of FIG. 3 in addition to external component indexing and mounting means therein.
Figure 5:
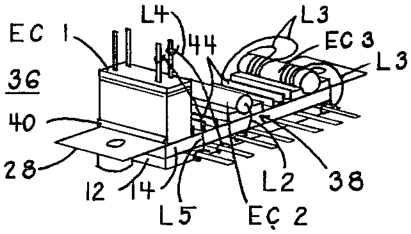
FIGURE 5 is a perspective of the functional circuit package structure of FIG. 4 with a plurality of external components fully assembled therewith.

Referring now to FIGS. 4 and 5, an embodiment of the present invention comprising a unit package or functional building block 36 is shown which includes indexed mounting means 38 integral with the top or cover plate 28.

The indexed mounting means 38 comprises a plurality of conformal component mounts comprising a plurality of raised lands 40 or the like which define mounting surfaces 42 therebetween, adapted to conformally receive external components EC1, EC2 and EC3, for example, which comprise a ceramic filter, a resistance or capacitance element, and an inductance, respectively.

The lands 40 may be interspersed with heat radiating fins 44 or the like to improve the heat dissipation characteristics of the unit package 36. Additional heat fins (not shown) may be placed elsewhere on the package.

The external components EC1, EC2 and EC3 have terminal leads L1, L2 and L3, respectively.

As shown in FIG. 5, to fully assemble the external components EC1, EC2 and EC3 to the unit package 36, they are placed between the appropriate lands 40 on the conformal mounting surfaces 42 of the indexed mounting means 38 and their respective terminal leads L1, L2 and L3 are merely wrapped and soldered on the electric terminals T. Additionally, if desired, pressure sensitive or other suitable adhesive may be used to enhance the retention of the said external components EC1–EC3 on the indexed mounting means 38.

Extension leads such as L4 and L5 may also be used as shown between the terminal leads L1 and the electric terminals T where required.

As can now be readily seen from the foregoing specification and drawings, the present invention provides a new and novel functional building block or electric circuit unit package which permits rapid production of devices which incorporate it by unskilled labor.

Further, the unit package of the present invention has such simplicity of structure and relatively large working size as to permit mutual packaging of two or more integrated circuit chips and still provide sufficient isolation and shielding therebetween and sufficient heat dissipation characteristics by deliberate variance from miniaturization. Thus, the unit package of the present invention is of such a size as to permit its incorporation into other devices without the use of sophisticated tools, assembly jigs and the like.

Furthermore, the new and novel combination of package structure, integrated circuit technology, external component mounting means and mechanically strong electric terminals permit high-volume, low-cost, production of the unit packages (functional building blocks) of the present invention, with the self-contained features thereof reducing ultimate costs as well as initial costs of manufacture.

The structure of the present invention precludes the need for printed circuit boards or mounting assemblies heretofore deemed essential in the art for the purpose of mounting separate or external components. Further, the use of terminal boards, strips, lugs and the like, heretofore necessary for the interconnection of such components, is precluded by the structural combination of the present invention. In fact, external components, pursuant to the present invention, can now be wired directly to the mechanically strong electrical terminals of the integrated circuits of the unit package; and the external components are clearly position indexed during assembly by the indexed mounting means of the present invention.

Therefore, it is readily seen that the present invention satisfies a long felt need in the art for functional building blocks in the form of self-contained unit packages which make possible the manufacture of low-cost and reliable consumer devices which are particularly adapted to areas of lesser economic strength and lesser technological advancement.

What is claimed is:

1. A unit package which is a self-contained functional building block for electrical devices comprising a base plate; a cover plate; a frame portion sandwiched between said base and cover plates, bonded thereto and defining at least one compartment therebetween, said compartment containing integrated electric circuit components and the like; circuit mounting means on said base plate coextensive with said compartment and mounting said circuit components within said unit package; mechanically strong electric terminal means, integral with said unit package and selectively extending from points external to said unit package into said compartment and to interconnect said circuit components within said compartment with circuit components external of said unit package; at least some of said terminal means extending within said compartment being electrically connected to said components within said compartment, and integral indexed mounting means on an external surface of said unit package for mounting and retaining external circuit components on said package in predetermined physical relationship to said mechanically strong terminal means.

2. The unit package defined in claim 1, wherein said package further includes integral mounting means adapted to secure said package to a support.

3. The unit package defined in claim 1, wherein said frame portion comprises a peripheral wall and at least one transverse integral partition defining at least two internal compartments within said frame portion, cover plate and base plate.

4. The invention defined in claim 3, wherein said transverse partition includes a substantially coextensive, integral electromagnetic shielding plate extending beyond the dimensions of said compartments into said peripheral wall, said base plate and said cover plate.

5. The unit package defined in claim 1, wherein said frame portion defines at least two compartments within said package and further includes electromagnetic shielding means between the said compartments.

6. The unit package defined in claim 1, wherein said frame portion defines at least two compartments within said package and further includes electromagnetic shielding means between the said compartments; and wherein said package further includes integral mounting means adapted to secure said package to a support.

7. The invention defined in claim 1, wherein said integral indexed mounting means is integral with said cover plate and comprises a plurality of mounting surfaces external to said package and shaped to conformally receive preselected external circuit components.

8. The invention defined in claim 7, wherein said cover plate further includes integral heat radiating means.

9. The unit package defined in claim 1, wherein said package further includes externally integral heat radiating means.

10. The unit package defined in claim 1, wherein said package further includes externally integral heat radiating means; and wherein said frame portion defines at least two compartments within said package and further includes electromagnetic shielding means between the said compartments.

11. The unit package defined in claim 1, wherein said package further includes externally integral heat radiating means; wherein said frame portion defines at least two compartments within said package and further includes electromagnetic shielding means between the said compartments; and wherein said package further includes integral mounting means adapted to secure said package to a support.

12. The invention defined in claim 1, wherein said circuit mounting means comprises substrate layers coextensive with said compartment and integral with said base plate.

13. A functional building block adapted for mass production of electronic devices and the like by unskilled labor, said building block comprising an integral unit package having at least one internal compartment therein, integrated circuit means in said compartment; mechanically strong electric terminal means extending from within said compartment to points external of said package and electrically connected with said integrated circuit means; indexed mounting means integral with an external surface of said package for mounting and retaining external circuit components in predetermined physical relationship to said electric terminal means; integral mounting means formed in said package for securing said package to a support; and external heat dissipation means integral with said package; said package being sufficiently large and said electric terminal means being of sufficient strength and sufficiently spaced as to permit rapid handling and assembly of said package with external circuit components by unskilled labor through the use of basic hand tools.

14. The invention defined in claim 13, wherein said package includes at least two internal compartments and electromagnetic isolating means between said compartments.

15. A unit package which is a self-contained functional building block for electrical devices comprising a base plate; a cover plate; a frame portion sandwiched between said base and cover plates, bonded thereto and defining at least one compartment therebetween, said compartment containing integrated electric circuit components and the like; circuit mounting means on said base plate coextensive with said compartment and mounting said circuit components within said unit package; mechanically strong electric terminal means, integral with said unit package and selectively extending from points external to said unit package into said compartment and to interconnect said circuit components within said compartment with circuit components external of said unit package; at least some of said terminal means extending within said compartment being electrically connected to said components within said compartment, wherein said frame portion comprises a peripheral wall and at least one transverse integral partition defining at least two internal compartments within said frame portion, cover plate and base plate; and wherein said transverse partition includes a substantially coextensive, integral electromagnetic shielding plate extending beyond the dimensions of said compartments into said peripheral wall, said base plate and said cover plate.

References Cited

UNITED STATES PATENTS

| | | |
|---|---|---|
| 3,141,999 | 7/1964 | Schneider. |
| 3,292,241 | 12/1966 | Carroll. |
| 3,312,771 | 4/1967 | Hessinger et al. |

OTHER REFERENCES

A.P.C., application of W. Niedermyer, Ser. No. 330,523, published May 18, 1943, now abandoned.

DARRELL L. CLAY, Primary Examiner

U.S. Cl. X.R.

29—588, 627; 174—35; 317—100, 101, 234